United States Patent
Nagano et al.

(10) Patent No.: US 7,810,701 B2
(45) Date of Patent: Oct. 12, 2010

(54) METHOD FOR BONDING METALLIC TERMINALS BY USING ELASTIC CONTACT

(75) Inventors: Shinichi Nagano, Miyagi-ken (JP); Shin Yoshida, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/411,254

(22) Filed: Mar. 25, 2009

(65) Prior Publication Data

US 2009/0250154 A1 Oct. 8, 2009

Related U.S. Application Data

(63) Continuation of application No. PCT/JP2007/068184, filed on Sep. 19, 2007.

(30) Foreign Application Priority Data

Sep. 26, 2006 (JP) ............................. 2006-260527

(51) Int. Cl.
*B23K 1/00* (2006.01)
*B23K 31/02* (2006.01)
(52) U.S. Cl. .................. 228/112.1; 228/180.21; 228/248.1; 219/56.22; 219/85.22
(58) Field of Classification Search .................. None
See application file for complete search history.

(56) References Cited

U.S. PATENT DOCUMENTS

| | | | | |
|---|---|---|---|---|
| 5,071,787 A | * | 12/1991 | Mori et al. | 29/840 |
| 5,497,936 A | * | 3/1996 | Vojta et al. | 228/173.5 |
| 5,980,270 A | * | 11/1999 | Fjelstad et al. | 439/71 |
| 6,279,227 B1 | * | 8/2001 | Khandros et al. | 29/885 |
| 6,291,806 B1 | * | 9/2001 | Quick et al. | 219/633 |
| 6,374,487 B1 | * | 4/2002 | Haba et al. | 29/840 |
| 6,548,790 B1 | * | 4/2003 | Trucco | 219/605 |
| 6,727,580 B1 | * | 4/2004 | Eldridge et al. | 257/692 |
| 6,746,725 B2 | * | 6/2004 | Nakamuta et al. | 427/565 |
| 6,851,598 B2 | * | 2/2005 | Gebauer et al. | 228/180.22 |
| 7,059,047 B2 | * | 6/2006 | Dozier et al. | 29/845 |

(Continued)

FOREIGN PATENT DOCUMENTS

JP 52-85362 7/1977

(Continued)

OTHER PUBLICATIONS

International Search Report dated Dec. 25, 2007 from International Application No. PCT/JP2007/068184.

*Primary Examiner*—Kiley Stoner
(74) *Attorney, Agent, or Firm*—Beyer Law Group LLP

(57) ABSTRACT

A connection electrode that is formed of solder on an electronic component side and a tip portion of an elastic contact each other at a contact portion. Regarding the elastic contact, a resistive layer is formed in the tip portion, and the tip portion is placed in a clearance of an induction coil. When a predetermined high-frequency current is passed through the induction coil, electromagnetic induction causes the resistive layer to generate heat. Solder that forms the connection electrode is melt, and flows onto the tip portion of the elastic contact. Thus, the tip portion of the elastic contact and the connection electrode can be strongly bonded together at the contact portion that is a single point therebetween.

13 Claims, 5 Drawing Sheets

U.S. PATENT DOCUMENTS

| | | | |
|---|---|---|---|
| 7,140,884 B2 * | 11/2006 | Brodsky et al. | 439/66 |
| 7,161,122 B2 * | 1/2007 | DeBonis | 219/603 |
| 7,279,788 B2 * | 10/2007 | Canella | 257/692 |
| 7,378,297 B2 * | 5/2008 | Beyne | 438/108 |
| 7,550,855 B2 * | 6/2009 | Hantschel et al. | 257/776 |
| 7,579,269 B2 * | 8/2009 | Eldridge et al. | 438/618 |
| 7,621,044 B2 * | 11/2009 | Eldridge et al. | 29/876 |
| 2002/0056922 A1 * | 5/2002 | Funaya et al. | 257/778 |
| 2003/0019836 A1 | 1/2003 | Clements et al. | |
| 2003/0038157 A1 * | 2/2003 | Gebauer et al. | 228/110.1 |
| 2003/0214045 A1 * | 11/2003 | Lahiri et al. | 257/761 |
| 2003/0218244 A1 * | 11/2003 | Lahiri et al. | 257/734 |
| 2004/0000428 A1 * | 1/2004 | Lii et al. | 174/260 |
| 2004/0003936 A1 * | 1/2004 | Schmitt et al. | 174/74 R |
| 2005/0040540 A1 * | 2/2005 | Haba et al. | 257/778 |
| 2005/0088192 A1 * | 4/2005 | Haga et al. | 324/754 |
| 2005/0205988 A1 * | 9/2005 | Radza | 257/704 |
| 2005/0208750 A1 * | 9/2005 | Hsu et al. | 438/614 |
| 2005/0279530 A1 * | 12/2005 | Kirby et al. | 174/267 |
| 2006/0138677 A1 * | 6/2006 | Khandros et al. | 257/780 |
| 2006/0208357 A1 * | 9/2006 | Meyer et al. | 257/738 |
| 2006/0237856 A1 * | 10/2006 | Eldridge et al. | 257/784 |
| 2006/0243483 A1 * | 11/2006 | Kirby et al. | 174/267 |
| 2006/0261491 A1 * | 11/2006 | Soeta et al. | 257/777 |
| 2007/0023486 A1 * | 2/2007 | Matsuura et al. | 228/179.1 |
| 2007/0045874 A1 * | 3/2007 | Eldridge et al. | 257/784 |
| 2007/0158816 A1 * | 7/2007 | Chow et al. | 257/690 |
| 2008/0254610 A1 * | 10/2008 | Suga et al. | 438/612 |

FOREIGN PATENT DOCUMENTS

| | | | |
|---|---|---|---|
| JP | 2000-174059 | | 6/2000 |
| JP | 2003-78075 | | 3/2003 |
| JP | 2003-78075 A | * | 3/2003 |
| JP | 2006-32548 | | 2/2006 |
| JP | 2006-508495 | | 3/2006 |
| JP | 2006-508495 A | * | 3/2006 |
| JP | 2006-147890 | | 6/2006 |

* cited by examiner

METHOD FOR BONDING METALLIC TERMINALS BY USING ELASTIC CONTACT

CLAIM OF PRIORITY

This application is a continuation of International Application No. PCT/JP2007/068184, filed Sep. 19, 2007, which claims benefit of the Japanese Patent Application No. 2006-260527 filed on Sep. 26, 2006, both of which are hereby incorporated by reference.

BACKGROUND OF THE INVENTION

1. Field of the Invention

The present invention relates to a method for bonding metallic terminals by using an elastic contact that is to elastically contact and to be connected to, for example, a connection terminal which is provided on an electronic component.

2. Description of the Related Art

In Japanese Unexamined Patent Application Publication No. 2006-147890, an invention that relates to a metal-to-metal bonding method, in which metal-to-metal bonding is performed by melting metal between a spiral contact and a connection terminal that is provided on an electronic component, is described.

Regarding conditions for melting and bonding metal in the metal-to-metal bonding method that is described in Japanese Unexamined Patent Application Publication No. 2006-147890, force with which a connection terminal is pressed is 0.05 N to 1 N, a temperature is 20° C. to 250° C., and a pressing time is one minute to three minutes. Additionally, when the temperature is set to a low room temperature of 20° C. and the force is set to be low, 48 hours are necessary.

However, in the metal-to-metal bonding method that is described in Japanese Unexamined Patent Application Publication No. 2006-147890, as also described in, for example, Paragraph (0027) thereof that "when shifting a spiral contact aside leads to disconnection", there is a problem that bonding strength between a connection terminal and a spiral contact tends to be insufficient and that reliability of the spiral contact tends to be reduced.

In other words, in the bonding method that is described in Japanese Unexamined Patent Application Publication No. 2006-147890, a configuration is provided, in which, by using a connection terminal having a polygonal cone shape and a spiral contact, the connection terminal and the spiral contact are bonded together not at a single point but at a plurality of points. In such a configuration, because bonding pressure per point tends to be insufficient, bonding strength at each bonded portion is reduced, and it is difficult to increase the overall bonding strength.

For this reason, in the bonding method that is described in Japanese Unexamined Patent Application Publication No. 2006-147890, reinforcement of bonding between the connection terminal and the spiral contact is implemented by using a thermosetting epoxy resin together with metal-to-metal bonding.

SUMMARY OF THE INVENTION

The present invention provides an elastic contact that can reliably increase bonding strength between the elastic contact and a connection terminal in order to solve the above-mentioned problems of the related art.

Furthermore, the present invention provides a method for bonding metallic terminals, in which bonding strength is increased by melting and bonding a connection terminal and an elastic contact at a single point.

According to an aspect of the present invention, there is provided a method for bonding metallic terminals, in which a plurality of elastic contacts and a plurality of connection terminals that are provided on an electronic component are individually bonded together. The method includes (a) a step of loading a bottom surface of the electronic component, on which the plurality of connection terminals are provided, onto the plurality of elastic contacts, and causing the plurality of connection terminals to contact the plurality of elastic contacts; and (b) a step of bonding the plurality of connection terminals and the plurality of elastic contacts together by heating contact portions at which the plurality of connection terminals and the plurality of elastic contacts contact each other.

According to another aspect of the present invention, there is provided a method for bonding metallic terminals, in which a plurality of elastic contacts and a plurality of connection terminals that are provided on an electronic component are individually bonded together. The method includes (c) a step of loading a bottom surface of the electronic component, on which the plurality of connection terminals are provided, onto the plurality of elastic contacts, and causing the plurality of connection terminals and the plurality of elastic contacts to partially contact each other; (d) a step of locally heating contact portions at which the plurality of connection terminals and the plurality of elastic contacts contact each other, and partially melting the contact portions; and (e) a step of bonding the plurality of connection terminals and the plurality of elastic contacts together with the melted contact portions.

According to the aspect of the present invention, the contact portions are locally heated, thereby bonding the connection terminals and the elastic contacts together. When the connection terminals are formed of solder, the solder can be melted. Thus, the connection terminals and the elastic contacts can be reliably bonded together.

The above methods may include, before the step (a) or (c), a step of coating at least either the plurality of connection terminals or the plurality of elastic contacts with a solder paste as the contact portions.

With the means given above, even when the contact terminals on the electronic component side are formed of a conductive metal other than solder, the contact terminals and the elastic contacts can be bonded together.

In the methods given above, in the step (b) or (d), the contact portions may be heated with Joule heat that is generated when a current is supplied to the contact portions. For example, the Joule heat may be caused by eddy currents that are generated by supplying lines of magnetic force by electromagnetic induction from the outside and by resistance elements that are included in the contact portions. Alternatively, the Joule heat may be caused by a current that is directly supplied to the contact portions from the outside and by the resistance elements that are included in the contact portions.

With the means given above, only the resistance elements can be reliably caused to generate heat, and heat generation by the other portions can be suppressed.

Alternatively, in the step (b) or (d), the contact portions may be heated with frictional heat that is generated by vibrating at least one of the electronic component and a substrate in a thickness direction in which the electronic component and the substrate face each other.

With the means given above, the frictional heat can be generated at the individual contact portions. Solder can be melted by the frictional heat, and the connection terminals and the elastic contacts can be bonded together.

Furthermore, after the step (b) or (e), a non-conductive adhesive is injected between the plurality of connection terminals, which are provided on the bottom surface of the electronic component, and the plurality of elastic contacts so that the plurality of connection terminals and the plurality of elastic contacts are fastened.

With the means given above, the connection terminals and the elastic contacts can be further strongly connected to each other.

According to any of the aspects of the present invention, a method for bonding metallic terminals, in which bonding strength can be increased by melting and bonding a connection terminal and an elastic contact at a single point, can be provided.

BRIEF DESCRIPTION OF THE DRAWINGS

FIG. 5A is a sectional view of a tip portion, which is taken along the line VA-VA shown in FIG. 2, FIG. 5B is a sectional view of portions other than the tip portion, which is taken along the line VB-VB shown in FIG. 2, and FIG. 5C is a sectional view of the portions other than the tip portion, and shows another example of a configuration of the portions shown in FIG. 5B.

DESCRIPTION OF THE PREFERRED EMBODIMENTS

Figure 1:
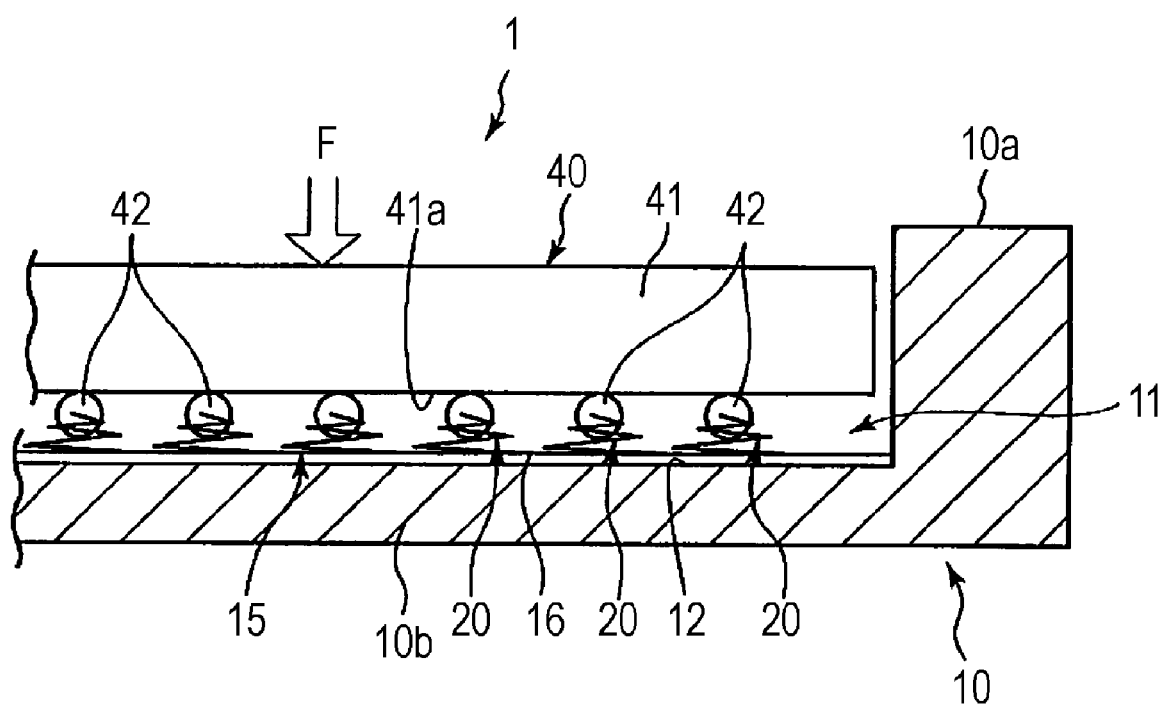
FIG. 1 is a partial sectional view of a connection device having elastic contacts according to an embodiment of the present invention.
Figure 2:
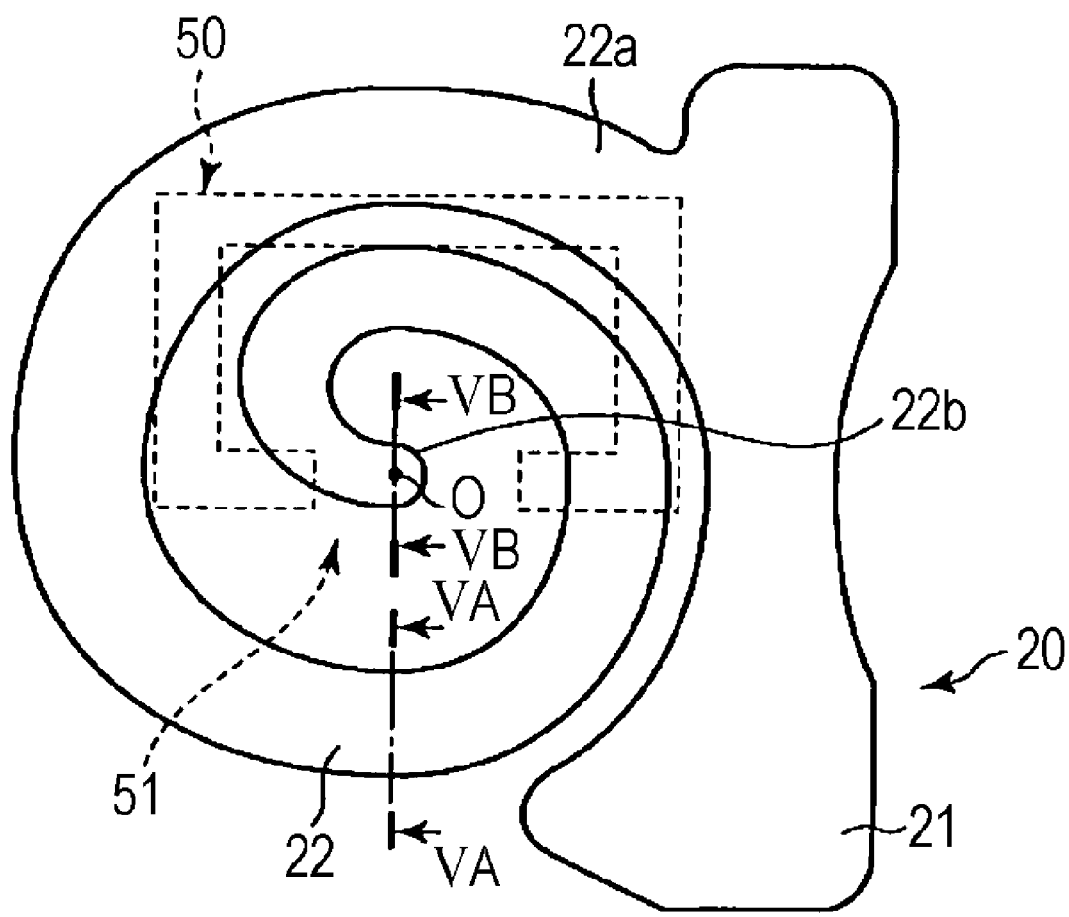
FIG. 2 is a plan view of each of the elastic contacts according to the embodiment of the present invention.
Figure 3:
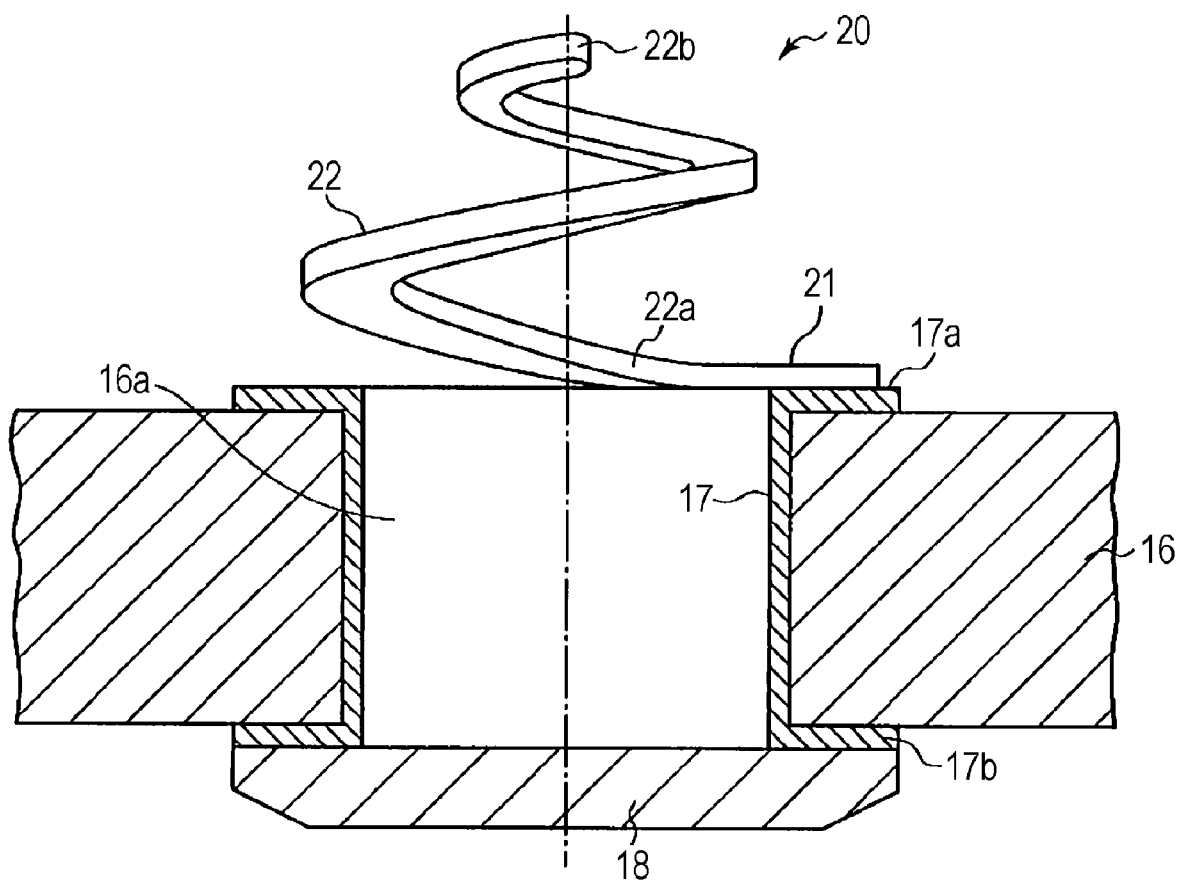
FIG. 3 is a partial sectional view of the elastic contact.
Figure 4:
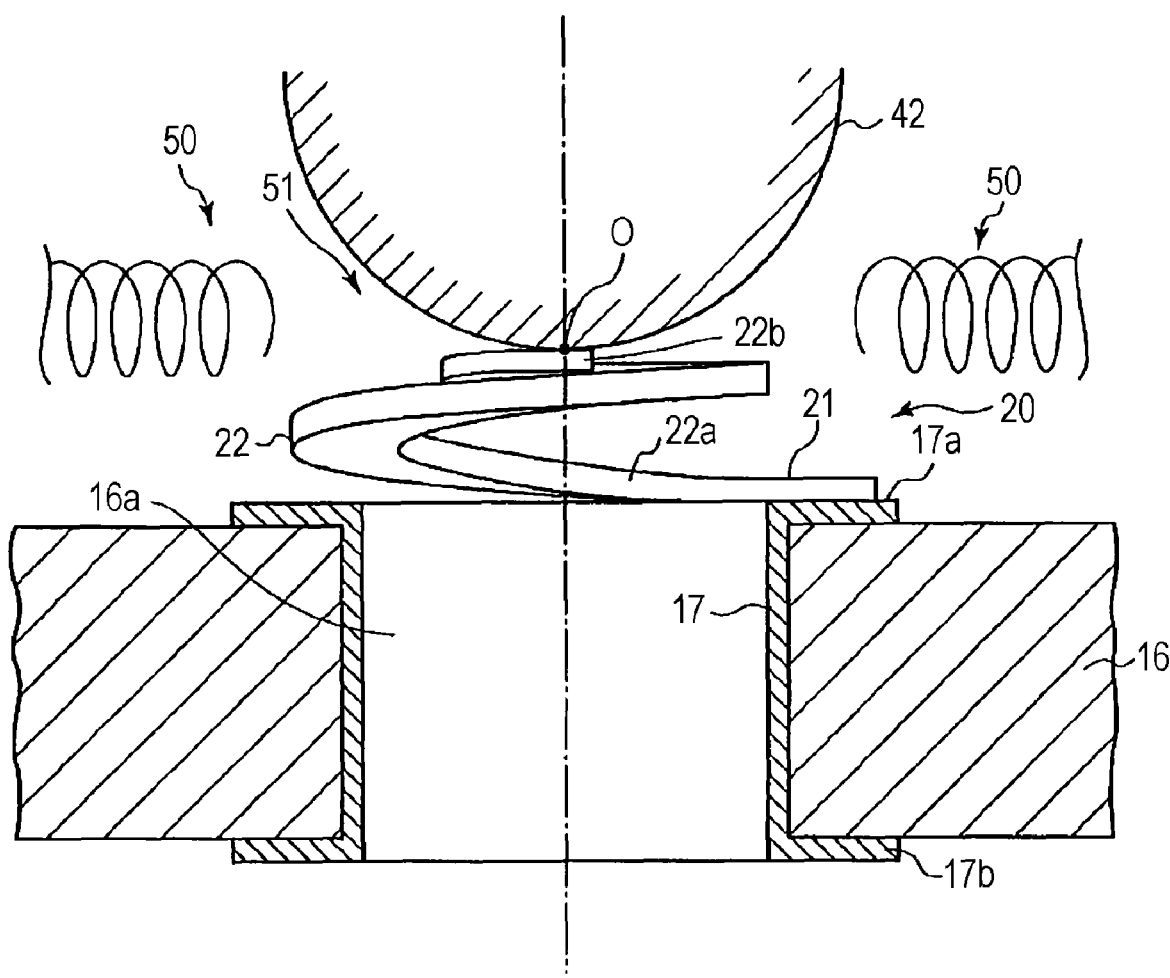
FIG. 4 is a partial sectional view that shows a state in which the elastic contact is compressed by a connection electrode (a solder ball) which contacts the elastic contact and that is similar to FIG. 3.
Figure 5A:
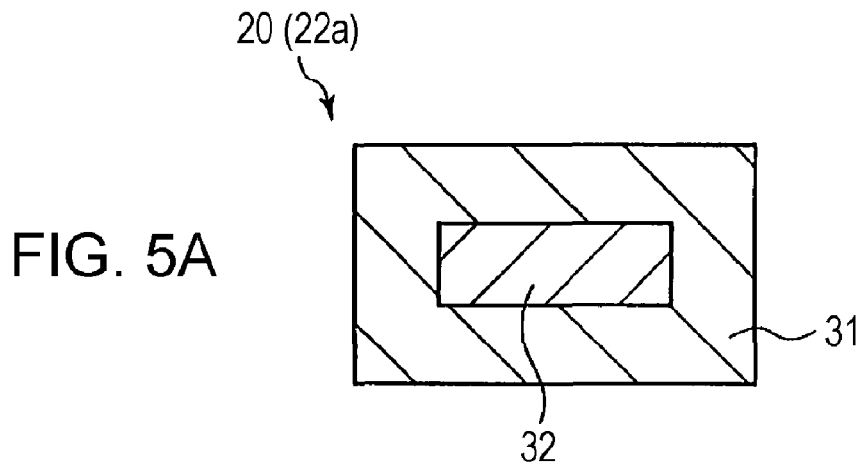
FIGS. 5A, 5B, and 5C are enlarged sectional views of the elastic contact.
Figure 5B:
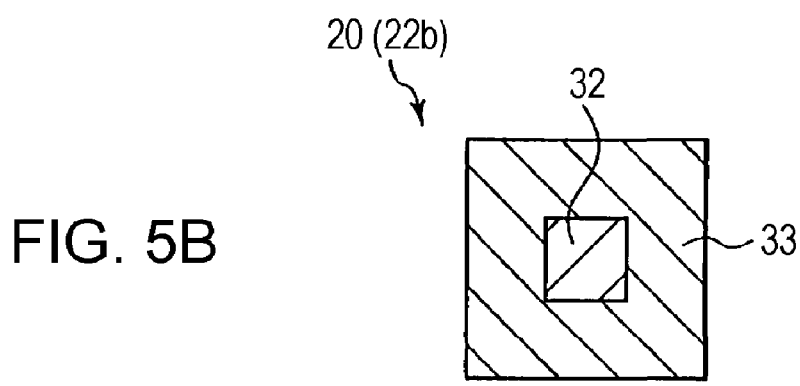
Figure 5C:
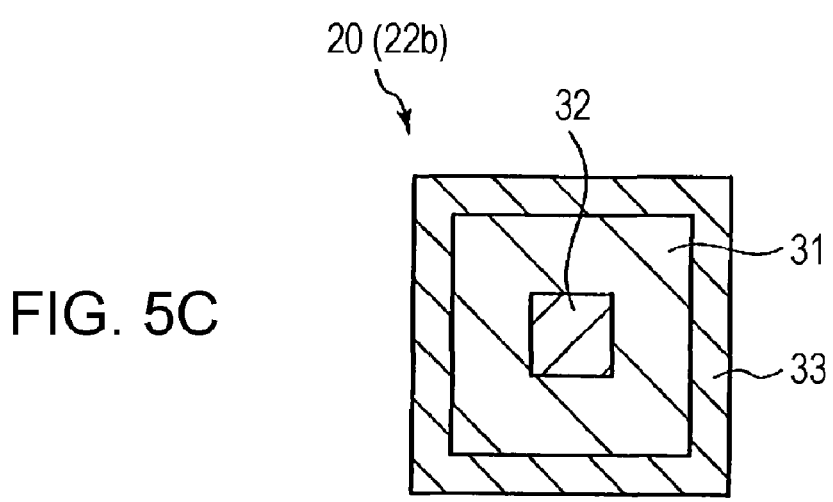

FIG. 1 is a partial sectional view of a connection device having elastic contacts according to an embodiment of the present invention. FIG. 2 is a plan view of each of the elastic contacts according to the embodiment of the present invention. FIG. 3 is a partial sectional view of the elastic contact shown in FIG. 2. FIG. 4 is a partial sectional view that shows a state in which the elastic contact is compressed by a connection electrode (a solder ball) which contacts the elastic contact and that is similar to FIG. 3. FIGS. 5A, 5B, and 5C are enlarged sectional views of the elastic contact. FIG. 5A is a sectional view of a tip portion, which is taken along the line VA-VA shown in FIG. 2. FIG. 5B is a sectional view of portions other than the tip portion, which is taken along the line VB-VB shown in FIG. 2. FIG. 5C is a sectional view of the portions other than the tip portion, and shows another example of a configuration of the portions shown in FIG. 5B.

A connection device shown FIG. 1 includes a base 10. The planar shape of the base 10 is a square shape. A side wall portion 10a that extends substantially vertically is formed at each of the four edges of the base 10. A region that is surrounded by the side wall portions 10a at the four edges is a recessed portion 11. The top surface of a bottom portion 10b of the recessed portion 11 is a support surface 12. A connection sheet 15 is placed on the support surface 12. Regarding the connection sheet 15, a plurality of elastic contacts 20 are provided on the surface of a base-material sheet 16 having flexibility.

As shown in FIG. 3, a large number of through holes 16a are formed in the base-material sheet 16, and each of conductive layers 17 is formed on the inner peripheral surface of a corresponding one of the through holes 16a by plating or the like. Each of connection lands 17a that conduct electricity to a corresponding one of the conductive layers 17 is formed on the surface of the base-material sheet 16. Each of connection lands 17b that conduct electricity to a corresponding one of the conductive layers 17 is formed on the rear surface of the base-material sheet 16.

A thin conductive metallic board is punched, thereby forming the elastic contacts 20, and, further, the elastic contacts 20 are subjected to a plating process. Each of the elastic contacts 20 is bonded to the surface of a corresponding one of the connection lands 17a with a conductive adhesive or the like. Alternatively, the elastic contacts 20 are formed by plating using a conductive material such as copper (Cu) or nickel (Ni). For example, the plurality of elastic contacts 20 are formed on the surface of a sheet that is different from the base-material sheet 16 by plating, and the different sheet is stacked on the base-material sheet 16. Each of the elastic contacts 20 is bonded to a corresponding one of the connection lands 17a with a conductive adhesive or the like.

Each of the elastic contacts 20 is placed on the base-material sheet 16, and then is formed in a cubic shape by applying external force. In this case, internal residual stress is removed by a heating process, so that the elastic contact 20 can exert elastic force in a cubic shape.

As shown in FIG. 3, bump electrodes 18 that are individually connected to the corresponding connection lands 17b are formed of a conductive material on the rear surface side of the base-material sheet 16. As shown in FIG. 1, when the connection sheet 15 is placed on the support surface 12, which is the surface of the bottom portion 10b of the base 10, the bump electrodes 18 are connected to corresponding conductive portions that are provided on the support surface 12.

The pitch of the elastic contacts 20 that are arranged on the support surface 12 is, for example, equal to or less than 2 mm, or equal to or less than 1 mm. The maximum value of the outer dimensions of each of the elastic contacts 20 is a value that is equal to or less than 2 mm, or equal to or less than 1 mm.

As shown in FIG. 1, an electronic component 40 is placed in the connection device 1. The electronic component 40 is, for example, an integrated circuit (IC) package. Various types of electronic elements such as IC bare chips may be placed in a body 41 that is hermetically sealed. A plurality of connection electrodes 42 are provided on a bottom surface 41a of the body 41. Each of the connection electrodes 42 enables a corresponding one of circuits that are provided in the body 41 to conduct electricity. Regarding the electronic component 40 in this embodiment, the connection electrode 42 has a spherical (ball) shape. Note that the connection electrode 42 may have a shape of a cone whose top has been cut off, or may be a flat pad.

The connection electrode 42 is formed of a conductive alloy that contains tin (Sn), i.e., solder that does not contain lead. The connection electrode 42 is preferably formed of a tin-bismuth alloy or a thin-silver alloy. However, the connection electrode 42 is not limited to a connection electrode that is formed of solder. Alternatively, for example, the connection electrode 42 may be formed of gold, silver, copper, an alloy that contains gold, silver, or copper, or the like.

As shown in FIGS. 2 and 3, regarding the elastic contact 20, a support portion 21 and an elastic deformation portion (an elastic arm) 22 are continuously formed in one piece. The elastic deformation portion 22 is formed to have a spiral form. A base portion 22a that is the starting end of the spiral of the elastic deformation portion 22 is integrated with the support portion 21. A tip portion 22b that is the finishing end of the spiral of the elastic deformation portion 22 is positioned at the center of the spiral. As shown in FIG. 2, the support portion 21 that is included in the elastic contact 20 is connected to the connection land 17a, and the elastic deformation portion 22 is three-dimensionally formed so that the tip portion 22b can be distant from the connection land 17a.

As shown in the sectional view of FIG. 5A, the elastic contact 20 is formed using a conductive layer 31, which is provided on the surface side, and an elastic layer 32, which is formed inside the conductive layer 31.

The conductive layer 31 is a single layer of copper or an alloy that contains copper. As the alloy that contains copper, a Corson alloy that contains Cu, Si, and Ni which have high electrical conductivity and high mechanical strength is preferably used. For example, a Cu—Ni—Si—Mg alloy that contains 96.2 percent by mass of Cu, 3.0 percent by mass of Ni, 0.65 percent by mass of Si, and 0.15 percent by mass of Mg may be used as the Corson alloy.

The elastic layer 32 is preferably formed of a metallic material having a resistivity higher than that of the conductive layer 31, a mechanical strength higher than that of the conductive layer 31, and a flexural modulus higher than that of the conductive layer 31. For example, an Ni layer or an alloy layer that contains Ni may be used as the elastic layer 32. An Ni—X alloy (wherein X is at least one of P, W, Mn, Ti, and Be) is used as an Ni alloy. The periphery of the conductive layer 31 is subjected to electro plating or electroless plating, thereby forming the elastic layer 32. The elastic layer 32 is preferably an Ni—P alloy that is formed by electroless plating. The concentration of phosphorus (P) in the Ni—P alloy is set to be equal to or higher than 10 at. % and be equal to or lower than 30 at. %, whereby at least one portion of the Ni—P alloy becomes amorphous, so that a high elastic modulus and a high tensile strength can be obtained. Alternatively, the elastic layer 32 may be formed of an Ni—W alloy. Also in this case, the concentration of tungsten (W) is set to be equal to or higher than 10 at. % and be equal to or lower than 30 at. %, whereby at least one portion of the Ni—W alloy becomes amorphous, so that a high elastic modulus and a high tensile strength can be obtained. Furthermore, in the sectional view of FIG. 5A, both the thickness and width of the elastic deformation portion 22 are equal to or larger than 1 μm and equal to or smaller than 100 μm.

As shown in FIG. 5B, the tip portion 22b of the elastic deformation portion 22 has, as in the above-mentioned case, the elastic layer 32 at the center. However, the base portion 22a shown in FIG. 5A is different from the tip portion 22b shown in FIG. 5B in that a resistive layer 33, which has a resistivity which is much higher than that of the conductive layer 31, is formed on the periphery of the elastic layer 32 instead of the conductive layer 31. Alternatively, as shown in FIG. 5C, a configuration may be used, in which the resistive layer 33 covers the periphery of the conductive layer 31.

A metallic material having a resistivity which is higher than that of a metallic material which forms the elastic layer 32, e.g., palladium (Pb) having a resistivity of $10.8 \times 10^{-8}$ Ωm, may be used for the resistive layer 33. However, the metallic material is not limited to palladium (Pb) as long as the metallic material is a metallic material having a high resistivity, and other metallic materials may be used. For example, Nichrome (registered trademark), which is an alloy that contains nickel (Ni) and chrome (Cr), may be used ($107.3 \times 10^{-8}$ Ωm).

Note that, when palladium (Pb) is used for the resistive layer 33, a configuration may be used, in which a layer of gold (Au) is provided as a surface layer (not illustrated) on the surface of the elastic layer 32 so that oxidation of palladium (Pb) can be avoided. However, when gold and solder are bonded together, a bonded portion easily becomes brittle. Thus, when a layer of gold (Au) is provided as the surface layer, a configuration is preferably used, in which a very thin layer of gold (Au) is formed by flash plating on the surface of the resistive layer 33 of palladium (Pb) so that the surface layer is not thick.

Furthermore, solder having a high melting point (240° C.) such as SnCu is used as solder that forms the connection electrode 42 or solder that is included in a solder paste. In this case, other components can be mounted using solder having a low melting point after bonding is performed.

Next, a method for bonding the elastic contacts 20 and the corresponding connection electrodes 42 together will be described.

As shown in FIG. 1, the electronic component 40 is loaded into the recessed portion 11, which is formed in the connection device 1, in a state in which the bottom surface 41a, on which the connection electrodes 42 are provided, faces downward.

Note that, in a case in which the connection electrode 42 are formed of a metallic material other than solder as described above, after the surface of each of the connection electrodes 42 or the surface of the tip portion 22b of each of the elastic contacts 20 is coated with a solder paste (not illustrated), the electronic component 40 is loaded into the recessed portion 11 of the connection device 1.

In this case, each of the connection electrodes 42 contacts the tip portion 22b of a corresponding one of the elastic contacts 20, which are provided in the recessed portion 11, directly or via the solder paste. As shown in FIG. 4, when the electronic component 40 is further pressed, the elastic deformation portion 22 is compressed. In this case, an appropriate pressing force allows the surface of the connection electrode 42 and the tip portion 22b of the elastic contact 20 to partially contact each other directly or via the solder paste (hereinafter, referred to as a "contact portion O"). Note that, the contact portion O is the tip portion 22b of the elastic contact 20, and is a portion including the resistive layer 33.

Next, the tip portion 22b of the elastic contact 20 is exclusively caused to generate heat, thereby heating the connection electrode 42 that contacts the tip portion 22b via the contact portion O. A preferable heating temperature in this case is about 220° C. to 250° C. The solder that forms the connection electrode 42 or the solder paste is partially melted with the heating temperature. The melted solder flows onto the surface of the tip portion 22b, and the tip portion 22b of the elastic contact 20 and the connection electrode 42 are strongly bonded together.

As described above, according to the embodiment of the present invention, the tip portion 22b of the elastic contact 20 and the connection electrode 42 are bonded together at the contact portion O that is a single point therebetween. Thus, bonding strength can be increased.

Some methods given below may be used as methods for bonding the tip portion 22b of the elastic contact 20 and the connection electrode 42 together by exclusively causing the tip portion 22b of the elastic contact 20 to generate heat.

First, induction heating using electromagnetic induction may be used as a first bonding method.

In this method, an induction coil 50 having a clearance 51 as one portion thereof and having a substantially C shape, for example, which is shown in FIGS. 2 and 4, is used. The contact portion O at which the connection electrode 42 and the tip portion 22*b* of the elastic contact 20 contacts each other is placed in the clearance 51 of the induction coil 50, and a predetermined alternating current is passed through. In this case, lines of magnetic force are supplied to the contact portion O by electromagnetic induction, and eddy currents are generated in the resistive layer 33. Joule heat can be locally generated using the eddy currents and a resistance element that is included in the resistive layer 33. The contact portion O is exclusively heated with the Joule heat, and the connection electrode 42, which is formed of solder, or the solder paste is melted, whereby metal-to-metal bonding can be realized between the tip portion 22*b* of the elastic contact 20 and the connection electrode 42 via the contact portion O. Thus, because only the resistive layer 33 that is included in the tip portion 22*b* of the elastic contact 20 can be caused to locally generate heat mainly in this induction heating method using electromagnetic induction, a burden on the electronic component 40 can be reduced.

A method for directly passing a current through the resistive layer 33 may be used as a second bonding method.

In this method, a current is directly passed between the tip portion 22*b* of the elastic contact 20 and the support portion 21, thereby causing the resistive layer 33 to generate heat. The connection electrode 42, which is formed of solder, or the solder paste is melted by heat that is generated in this case, whereby metal-to-metal bonding can be realized between the tip portion 22*b* of the elastic contact 20 and the connection electrode 42 via the contact portion O.

A method for bonding using a ultrasonic wave may be used as a third bonding method.

In this method, the electronic component 40 is loaded into the recessed portion 11 that is provided in the connection device 1, and the connection device 1 is placed on a ultrasonic vibration device in a state in which the electronic component 40 is firmly fixed. The electronic component 40 and the connection device 1 are vibrated at a predetermined ultrasonic frequency in the vertical direction (the thickness direction). In the course of this process, frictional heat is generated at the contact portion O, and the connection electrode 42 or the solder paste is melted. Thus, metal-to-metal bonding can be realized between the tip portion 22*b* of the elastic contact 20 and the connection electrode 42 via the contact portion O.

As described above, according to the embodiments of the present invention, each of the connection electrodes 42 of the electronic component 40 and the tip portion 22*b* of a corresponding one of the elastic contacts 20 contact each other at the contact portion O that is a single point before bonding is performed, and the connection electrode 42 and the tip portion 22*b* can be bonded together via the contact portion O. Thus, bonding strength can be increased.

The size of the contact portion O in any of the cases given above is small. Accordingly, energy for bonding, which is necessary when bonding is performed, can be reduced. In other words, bounding in which the bonding strength is high can be performed with a less energy. Thus, particularly in the third method for bonding using ultrasonic vibration, because a frequency range in which a vibration frequency can be set to be high can be used, damage to the electronic component 40 can be reduced.

Note that a configuration may be used, in which a non-conductive adhesive is injected between the connection electrodes 42, which are provided on the bottom surface 42*a* of the electronic component 40, and the elastic contacts 20, which are provided in the recessed portion 11, thereby fasting portions between the connection electrodes 42 and the elastic contacts 20 with the adhesive. In this case, bonding strength between each of the connection electrodes 42 of the electronic component 40 and a corresponding one of the elastic contacts 20 can be further increased.

In the embodiment that is described above with reference to FIG. 5A, a configuration is shown, in which the conductive layer 31 is provided on the periphery of the elastic layer 32. However, the present invention is not limited to the configuration. A configuration may be used, in which the conductive layer 31 is provided at the center, and in which the elastic layer 32 covers the periphery of the conductive layer 31. In this case, a configuration may be used, in which the resistive layer 33 that is formed of palladium or the like is provided on the surface of the elastic layer 32.

In any of the above-described embodiments, a spiral contact having a spiral shape is used as each of the elastic contacts 20. However, the present invention is not limited to the spiral contact. Examples of the elastic contact 20 include the following: a membrane-type contact, in which an elastic film that is formed of rubber, elastomer, or the like is stuck to the rear surface of a metallic film having a dome shape; a spring pin (a contact pin), in which a tip portion serving as a contact point is bended to have a substantially U shape, and the entire body of which can be elastically deformed; a stressed metal; a contact probe (see Japanese Unexamined Patent Application Publication No. 2002-357622); and a contact that is formed using an elastic contact point, such as a volute spring.

What is claimed is:

1. A method for bonding a plurality of elastic contacts having elastic deformation portions to a plurality of metallic connection terminals, the plurality of connection terminals being provided on an electronic component, the method comprising:

(c) a step of loading a bottom surface of the electronic component, on which the plurality of connection terminals are provided, onto the plurality of elastic contacts, and causing the plurality of connection terminals to contact corresponding one of the plurality of elastic contacts at a tip portion thereof, the tip portion of each elastic contact being a single point of contact with the corresponding connection terminal;

(d) a step of locally heating individual contact portions at which the plurality of connection terminals and the tip portion of the plurality of elastic contacts contact each other, and partially melting the contact portions; and (e) a step of bonding the plurality of connection terminals and the plurality of elastic contacts together with the respective melted contact portions.

2. The method according to claim 1, further comprising, before the step (c), a step of coating at least either the plurality of connection terminals or the plurality of elastic contacts with a solder paste as the contact portions.

3. The method according to claim 1, wherein, in the step (d), the contact portions are locally heated with Joule heat, the Joule heat being generated when a current is supplied to the tip portions.

4. The method according to claim 1, wherein, in the step (d), the contact portions are locally heated by friction between the tip portion of the elastic contacts and the corresponding connection terminals, frictional heat being generated by vibrating at least one of the electronic component and a substrate in a thickness direction in which the electronic component and the substrate face each other.

5. The method according to claim 1, wherein, after the step (e), a non-conductive adhesive is injected between the plurality of connection terminals, the plurality of connection terminals being provided on the bottom surface of the electronic component, and the plurality of elastic contacts so that the plurality of connection terminals and the plurality of elastic contacts are fastened.

6. A method for bonding a plurality of metallic connection terminals to a plurality of elastic contacts, the plurality of connection terminals being provided on an electronic component, the plurality of elastic contacts being placed in correspondence with the plurality of connection terminals, the method comprising:
   (a) a step of loading a bottom surface of the electronic component, on which the plurality of connection terminals are provided, onto the plurality of elastic contacts, and causing each of the plurality of connection terminals to contact corresponding one of the plurality of elastic contacts; and
   (b) a step of bonding the plurality of connection terminals and the plurality of elastic contacts together by heating contact portions at which the plurality of connection terminals and the plurality of elastic contacts contact each other,
   wherein, in the step (b), the contact portions are heated with Joule heat, the Joule heat being generated when a current is supplied to the contact portions,
   and wherein the Joule heat is caused by eddy currents and resistance elements, the eddy currents being generated by supplying lines of magnetic force by electromagnetic induction from the outside, the resistance elements being included in the contact portions.

7. The method according to claim 6, further comprising, before the step (a), a step of coating at least either the plurality of connection terminals or the plurality of elastic contacts with a solder paste as the contact portions.

8. The method according to claim 6, wherein, in the step (b), the contact portions are heated with frictional heat, the frictional heat being generated by vibrating at least one of the electronic component and a substrate in a thickness direction in which the electronic component and the substrate face each other.

9. The method according to claim 6, wherein, after the step (b), a non-conductive adhesive is injected between the plurality of connection terminals, the plurality of connection terminals being provided on the bottom surface of the electronic component, and the plurality of elastic contacts so that the plurality of connection terminals and the plurality of elastic contacts are fastened.

10. A method for bonding a plurality of metallic connection terminals to a plurality of elastic contacts, the plurality of connection terminals being provided on an electronic component, the plurality of elastic contacts being placed in correspondence with the plurality of connection terminals, the method comprising:
    (a) a step of loading a bottom surface of the electronic component, on which the plurality of connection terminals are provided, onto the plurality of elastic contacts, and causing each of the plurality of connection terminals to contact corresponding one of the plurality of elastic contacts; and
    (b) a step of bonding the plurality of connection terminals and the plurality of elastic contacts together by heating contact portions at which the plurality of connection terminals and the plurality of elastic contacts contact each other,
    wherein, in the step (b), the contact portions are heated with Joule heat, the Joule heat being generated when a current is supplied to the contact portions,
    and wherein the Joule heat is caused by a current and resistance elements, the current being directly supplied to the contact portions from the outside, the resistance elements being included in the contact portions.

11. The method according to claim 10, further comprising, before the step (a), a step of coating at least either the plurality of connection terminals or the plurality of elastic contacts with a solder paste as the contact portions.

12. The method according to claim 10, wherein, in the step (b), the contact portions are heated with frictional heat, the frictional heat being generated by vibrating at least one of the electronic component and a substrate in a thickness direction in which the electronic component and the substrate face each other.

13. The method according to claim 10, wherein, after the step (b), a non-conductive adhesive is injected between the plurality of connection terminals, the plurality of connection terminals being provided on the bottom surface of the electronic component, and the plurality of elastic contacts so that the plurality of connection terminals and the plurality of elastic contacts are fastened.

* * * * *